US012325936B2

(12) United States Patent
Kaneko et al.

(10) Patent No.: US 12,325,936 B2
(45) Date of Patent: Jun. 10, 2025

(54) ALUMINUM NITRIDE SUBSTRATE MANUFACTURING METHOD, ALUMINUM NITRIDE SUBSTRATE, AND METHOD OF REMOVING STRAIN LAYER INTRODUCED INTO ALUMINUM NITRIDE SUBSTRATE BY LASER PROCESSING

(71) Applicants: KWANSEI GAKUIN EDUCATIONAL FOUNDATION, Hyogo (JP); TOYO ALUMINIUM KABUSHIKI KAISHA, Osaka (JP); TOYOTA TSUSHO CORPORATION, Aichi (JP)

(72) Inventors: Tadaaki Kaneko, Sanda (JP); Daichi Dojima, Sanda (JP); Moeko Matsubara, Osaka (JP); Yoshitaka Nishio, Osaka (JP)

(73) Assignees: KWANSEI GAKUIN EDUCATIONAL FOUNDATION, Hyogo (JP); TOYO ALUMINIUM KABUSHIKI KAISHA, Osaka (JP); TOYOTA TSUSHO CORPORATION, Aichi (JP)

( * ) Notice: Subject to any disclaimer, the term of this patent is extended or adjusted under 35 U.S.C. 154(b) by 181 days.

(21) Appl. No.: 17/996,198

(22) PCT Filed: Mar. 30, 2021

(86) PCT No.: PCT/JP2021/013748
§ 371 (c)(1),
(2) Date: Oct. 13, 2022

(87) PCT Pub. No.: WO2021/210395
PCT Pub. Date: Oct. 21, 2021

(65) Prior Publication Data
US 2023/0212785 A1 Jul. 6, 2023

(30) Foreign Application Priority Data

Apr. 14, 2020 (JP) ................................. 2020-072552

(51) Int. Cl.
*C30B 33/02* (2006.01)
*B23K 26/382* (2014.01)
(Continued)

(52) U.S. Cl.
CPC ............ *C30B 33/02* (2013.01); *B23K 26/382* (2015.10); *B23K 26/402* (2013.01);
(Continued)

(58) Field of Classification Search
CPC .......................... B23K 26/382; H05K 2203/11
See application file for complete search history.

(56) References Cited

U.S. PATENT DOCUMENTS 6,257,224 B1 7/2001 Yoshino et al.
2005/0059229 A1* 3/2005 Minemoto .......... H01L 21/0254
257/E21.119
(Continued)

FOREIGN PATENT DOCUMENTS

CN 105097712 A 11/2015
EP 2093312 A1 8/2009
(Continued)

OTHER PUBLICATIONS

English translation of International Search Report from PCT/JP2021/013748 dated Jul. 6, 2021 (2 pages).
(Continued)

*Primary Examiner* — Virak Nguon
(74) *Attorney, Agent, or Firm* — Calfee, Halter & Griswold LLP

(57) ABSTRACT

The problem to be solved by the present invention is to provide a novel technique that can remove a strained layer
(Continued)

introduced into an aluminum nitride substrate. In order to solve this problem, the present aluminum nitride substrate manufacturing method involves a strained layer removal step for removing a strained layer in an aluminum nitride substrate by heat treatment of the aluminum nitride substrate in a nitrogen atmosphere. In this way, the present invention can remove a strained layer that has been introduced into an aluminum nitride substrate.

3 Claims, 4 Drawing Sheets

(51) Int. Cl.
    *B23K 26/402*     (2014.01)
    *B23K 103/00*     (2006.01)
    *C30B 29/40*     (2006.01)
    *C30B 33/04*     (2006.01)
    *H01L 21/02*     (2006.01)

(52) U.S. Cl.
    CPC ............ *C30B 29/403* (2013.01); *C30B 33/04* (2013.01); *B23K 2103/52* (2018.08); *H01L 21/02389* (2013.01); *H01L 21/0243* (2013.01)

(56) References Cited

U.S. PATENT DOCUMENTS

| | | |
|---|---|---|
| 2011/0012199 A1 | 1/2011 | Nygaard et al. |
| 2014/0011345 A1 | 1/2014 | Chua et al. |
| 2019/0090346 A1* | 3/2019 | Kondo .............. H01L 23/49827 |

FOREIGN PATENT DOCUMENTS

| | | |
|---|---|---|
| JP | H05-121845 A | 5/1993 |
| JP | H10-305420 A | 11/1998 |
| JP | 2003-218518 A | 7/2003 |
| JP | 2012-074451 A | 4/2012 |
| JP | 2020038955 A * | 3/2020 |
| WO | 2007145679 A2 | 12/2007 |
| WO | 2017/169749 A1 | 10/2017 |

OTHER PUBLICATIONS

EPO Communication and European Search Report issued in corresponding EP application No. 21789083.9 on Apr. 24, 2024 (6 pages).

* cited by examiner

ALUMINUM NITRIDE SUBSTRATE MANUFACTURING METHOD, ALUMINUM NITRIDE SUBSTRATE, AND METHOD OF REMOVING STRAIN LAYER INTRODUCED INTO ALUMINUM NITRIDE SUBSTRATE BY LASER PROCESSING

CROSS-REFERENCE TO RELATED APPLICATIONS

This application is a 371 of PCT Application No. PCT/JP2021/013748, filed on Mar. 30, 2021, which claims priority to Japanese Application No. 2020-072552, filed on Apr. 14, 2020, the contents of which are hereby incorporated by reference as if recited in their entirety.

Technical Field

The present invention relates to a method for manufacturing an aluminum nitride substrate, an aluminum nitride substrate, and a method for removing a strained layer introduced into the aluminum nitride substrate by laser processing.

Background Art

In the manufacture of a semiconductor substrate, a method of processing a semiconductor substrate by irradiating the semiconductor substrate with a laser has been conventionally adopted.

Patent Literature 1 discloses an invention in which a converging point of a laser beam having a wavelength with absorbency with respect to an object to be processed is positioned on an upper surface of the object to be processed, the object to be processed is irradiated with the laser beam, and ablation processing is performed to form a groove on the upper surface of the object to be processed. Furthermore, it can be understood that the invention described in Patent Literature 1 is a method that can be applied to a known semiconductor material.

CITATION LIST

Patent Literature

Patent Literature 1: JP H10-305420 A

SUMMARY OF INVENTION

Technical Problem

By the way, in the method of irradiating the object to be processed with the laser beam described above, strains can be introduced into the semiconductor substrate that is the object to be processed due to the irradiation. The strains become a cause of dislocation in the semiconductor substrate, and thus it is desirable that the strains can be removed. As a factor of introducing the strains, not only the irradiation of the laser beam but also a known semiconductor process such as mechanical polishing is assumed.

For example, when a dislocation occurs in an aluminum nitride substrate, it is possible that the dislocation is taken over to a growth layer formed by an epitaxial growth using the aluminum nitride substrate as an underlying substrate. Accordingly, it is desirable that the strains can be removed.

An object of the present invention is to provide a novel technique capable of removing the strained layer introduced into the aluminum nitride substrate.

Solution to Problem

In order to solve the problems above, the present invention is a method for manufacturing an aluminum nitride substrate, and the method includes a strained layer removal step of removing a strained layer of the aluminum nitride substrate by heat treating the aluminum nitride substrate under a nitrogen atmosphere. As described above, in the present invention, the strained layer introduced into the aluminum nitride substrate can be removed.

In a preferred mode of the present invention, the strained layer removal step heat treats the aluminum nitride substrate under conditions with a heating temperature of 1900° C. or less. As described above, in the present invention, the strained layer of the AlN substrate can be removed while suppressing occurrence of Al droplets.

In a preferred mode of the present invention, in the strained layer removal step, the aluminum nitride substrate is heat treated under the conditions with a nitrogen back pressure of 10 kPa or more. As described above, in the present invention, the strained layer of the AlN substrate can be removed while suppressing occurrence of Al droplets.

In a preferred mode of the present invention, a processing step that performs laser processing of removing a part of the aluminum nitride substrate by irradiating the aluminum nitride substrate with a laser is further included. As described above, in the present invention, the strained layer of the AlN substrate can be removed while suppressing occurrence of Al droplets.

In a preferred mode of the present invention, the processing step is a step of forming through holes in the aluminum nitride substrate. As described above, since the present invention can remove a strained layer of aluminum nitride as the underlying substrate for epitaxial growth, it can contribute to suppression of dislocation introduction in the epitaxial growth.

Advantageous Effects of Invention

According to the technique disclosed, it is possible to provide a novel technique capable of removing the strained layer introduced into the aluminum nitride substrate.

Other problems, features and advantages will become apparent by reading the following description of embodiments as well as understanding the drawings and claims.

DESCRIPTION OF EMBODIMENTS

Figure 1:
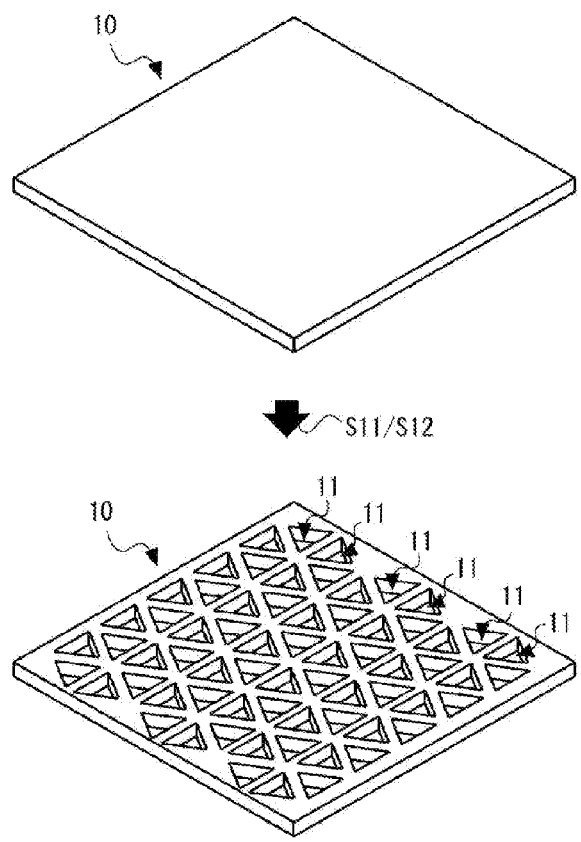
FIG. 1 is an explanatory view for explaining a method for manufacturing an AlN substrate according to an embodiment.

Hereinafter, preferred embodiments of the method for manufacturing the aluminum nitride substrate according to the present invention will be described in detail with reference to the accompanying drawings.

The technical scope of the present invention is not limited to the embodiments illustrated in the accompanying drawings, and can be appropriately changed within the scope described in the claims.

The drawings attached hereto are conceptual diagrams, and the relative dimensions and the like of each member do not limit the present invention.

The present description may be referred to as an upper side or a lower side based on the upper and lower sides of the drawings for the purpose of describing the invention, but the upper and lower sides are not limited in relation to usage modes or the like of the aluminum nitride substrate of the present invention.

In addition, in the following description of the embodiments and the accompanying drawings, the same reference numerals are given to the same configurations, and redundant description is omitted.

<<Method for Manufacturing Aluminum Nitride Substrate>>

Figure 2:
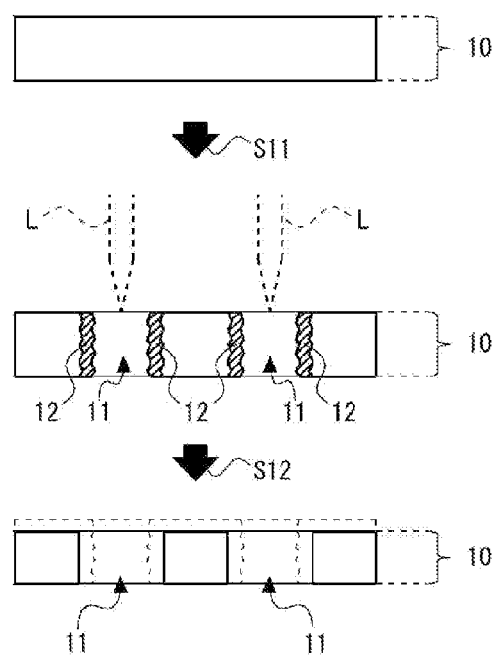
FIG. 2 is an explanatory view for explaining a processing step and a strained layer removal step according to the embodiment.

FIGS. 1 and 2 illustrate steps of a method for manufacturing an aluminum nitride substrate (hereinafter, it is simply referred to as an "AlN substrate") according to an embodiment of the present invention.

The method for manufacturing the AlN substrate according to the embodiment includes a strained layer removal step S12 of removing a strained layer 12 introduced into an AlN substrate 10 by a processing step S11 via heat treating the AlN substrate 10.

Furthermore, the method for manufacturing the AlN substrate according to the embodiment may further include the processing step S11 of performing laser processing of removing a part of the AlN substrate 10 by irradiating the AlN substrate 10 with a laser L.

Moreover, this embodiment can be understood as a method of removing the strained layer 12 introduced into the AlN substrate 10 by the laser processing, and the method includes the strained layer removal step S12 of heat treating the AlN substrate 10 after performing the laser processing on the AlN substrate 10.

The AlN substrate 10 (corresponding to an AlN wafer) may be a single crystal AlN substrate, may be a polycrystalline AlN substrate, may be a wafer or substrate processed from a bulk crystal, may be a wafer or substrate including an epitaxial growth layer, or may be a square wafer.

Crystal polymorphism of the AlN substrate 10 is not limited. Furthermore, off direction and off angle of the AlN substrate 10 are not limited.

Moreover, wafer size of the AlN substrate 10 is not limited. In addition, a film thickness of the AlN substrate 10 is not limited.

Furthermore, doping concentration of the AlN substrate 10 is not limited. In addition, the AlN substrate 10 is not limited in its dopant element.

Hereinafter, each step of the embodiment will be described in detail.

The processing step S11 is a step of performing laser processing of removing a part of the AlN substrate 10 by irradiating the AlN substrate 10 with the laser L.

The term "laser processing" in the description of the present description refers to processing of forming a groove on the upper surface of the AlN substrate 10 or forming a damaged region inside the AlN substrate 10 by positioning the converging point of the laser beam having the wavelength with absorbency with respect to the AlN substrate 10 that is an object to be processed on the upper surface or inside of the AlN substrate 10 and irradiating the AlN substrate 10 with the laser beam.

In addition, the laser processing refers to a method of selectively processing a part of the object to be processed by irradiating the object to be processed with a light wave having energy equivalent to binding energy in a material constituting the object to be processed while controlling a laser irradiation portion (corresponding to the converging point) and converging the light.

Furthermore, the processing step S11 is preferably a step of irradiating the AlN substrate 10 with the laser L having a wavelength of 532 nm.

The wavelength of the laser L is preferably 808 nm or less, preferably 650 nm or less, preferably 635 nm or less, preferably 589 nm or less, preferably 532 nm or less, preferably 473 nm or less, preferably 460 nm or less, preferably 445 nm or less, and preferably 405 nm or less.

Furthermore, the wavelength of the laser L is preferably 355 nm or more, preferably 405 nm or more, preferably 445 nm or more, preferably 460 nm or more, preferably 532 nm or more, preferably 589 nm or more, preferably 635 nm or more, and preferably 650 nm or more.

The wavelength of the laser L is, for example, a wavelength in a wavelength band classified as a visible light region.

Furthermore, the processing step S11 can be performed based on a known or commonly used optical system.

In the processing step S11, a known light source can be appropriately adopted according to the wavelength of the laser L and the like.

The laser L used in the processing step S11 is not limited in terms of its active medium, oscillation form, repetition frequency, pulse width, beam spot diameter, output power, and polarization characteristics.

The optical system used in the processing step S11 appropriately includes a known or conventional mirror, a scanner including an axial rotation motor for alignment and the like, a condenser lens, and a grating.

Magnification and numerical aperture (NA) of the converging lens of the optical system used in the processing step S11 are not limited.

In addition, the processing step S11 is a step of forming through holes 11 in the AlN substrate 10.

Here, it can be understood that the processing step S11 is an embrittlement processing step of reducing strength of the AlN substrate 10 by forming the through holes 11.

Moreover, in the processing step S11, the laser irradiation portion (corresponding to the converging point) is scanned in a film thickness direction of the AlN substrate 10 during the formation of the through holes 11.

The through holes 11 can be adopted as long as they have a shape (a pattern) that reduces the strength of the AlN substrate 10.

Furthermore, in the epitaxial growth using the AlN substrate 10 as the underlying substrate, it is desirable to set the shape (the pattern) in which a desired growth layer can be obtained.

At this time, in the processing step S11, the laser L is scanned in a plane of the AlN substrate 10 according to the shape (pattern) described above.

Furthermore, in the embodiment, it is desirable to adopt an optimum pattern by physical properties (crystal orientation and the like) of the semiconductor material of the growth layer or the AlN substrate 10, and by a growth method of the growth layer. Note that a width and a depth of the shape (the pattern) are not limited.

In addition, the processing step S11 is a step of processing the surface of the AlN substrate 10 into a mesa shape.

The term "mesa shape" in the description of the present description corresponds to an uneven shape, and there is no limitation on the angle formed by the upper wall and the side wall in the uneven shape.

In addition, a processing depth in the processing step S11 is not limited. Moreover, when the processing step S11 is a step of processing the surface of the AlN substrate 10 into the mesa shape, the processing step S11 forms a concave portion on the surface of the AlN substrate 10 instead of the above through holes 11.

In addition, in the processing step S11, the through holes 11 or a convex portion is formed by scanning a focal point of the laser L from a front surface (corresponding to an upper surface) to a bottom surface (corresponding to a lower surface) of the AlN substrate 10.

In the processing step S11, at least a part of known techniques such as methods described in, for example, JP H10-305420 A, JP 2002-192370 A, JP 2016-111147 A, and the like, can be appropriately adopted.

The processing step S11 in the embodiment of the present invention can be understood to correspond to an embrittlement processing step, for example.

The strained layer removal step S12 is a step of removing the strained layer 12 introduced into the AlN substrate 10 by the processing step S11 by heat treating the AlN substrate 10.

Moreover, it can be understood that the strained layer 12 corresponds to, for example, a damage layer.

In the strained layer removal step S12, a means for etching the AlN substrate 10 by heat treating the AlN substrate 10 can be adopted. At this time, in the strained layer removal step S12, a known or commonly used heat treatment mechanism can be appropriately adopted.

Furthermore, the strained layer removal step S12 can be naturally adopted as long as it is a means capable of removing the strained layer 12.

Moreover, the strained layer removal step S12 is a step of removing the strained layer 12 by thermal etching.

Furthermore, the strained layer removal step S12 is a step of etching the AlN substrate 10 under the nitrogen atmosphere (under the $N_2$ atmosphere). In addition, the term "nitrogen atmosphere" in the description of the present description corresponds to a vapor pressure of a vapor phase type containing nitrogen.

As an example, the strained layer removal step S12 is a step of housing the AlN substrate 10 in the above refractory material container and heat treating the refractory material container including the AlN substrate 10. Moreover, in a heating environment of the AlN substrate 10, a generated gas is appropriately exhausted.

Furthermore, the film thickness of the strained layer 12 removed in the strained layer removal step S12 can be appropriately set. At this time, the strained layer removal step S12 can be understood to achieve a desired etching rate by adjusting various parameters such as the heating temperature and the nitrogen back pressure.

The heating temperature of the AlN substrate 10 in the strained layer removal step S12 is preferably 2000° C. or less, preferably 1900° C. or less, preferably 1800° C. or less, and preferably 1700° C. or less.

Furthermore, the heating temperature is preferably 1400° C. or more, preferably 1500° C. or more, and preferably 1600° C. or more.

The nitrogen back pressure in the heat treatment of the AlN substrate 10 in the strained layer removal step S12 is preferably 102 kPa or less, preferably 90 kPa or less, preferably 70 kPa or less, preferably 50 kPa or less, preferably 20 kPa or less, preferably 10 kPa or less, preferably 1 kPa or less, preferably 102 Pa or less, preferably 10 Pa or less, preferably 1 Pa or less, preferably 10-1 Pa or less, and preferably 10-2 Pa or less.

Furthermore, the nitrogen back pressure is preferably 10-3 Pa or more, preferably 10-2 Pa or more, preferably 10-1 Pa or more, preferably 10 Pa or more, preferably 102 Pa or more, preferably 1 kPa or more, preferably 10 kPa or more, preferably 20 kPa or more, preferably 50 kPa or more, preferably 70 kPa or more, and preferably 90 kPa or more.

According to the present invention, it is possible to remove the strained layer 12 introduced into the AlN substrate 10 by the laser processing via including the strained layer removal step S12 of heat treating the AlN substrate 10.

In addition, according to the embodiment of the present invention, the AlN substrate 10 from which the strained layer 12 has been removed can be provided as the underlying substrate for epitaxial growth of semiconductor materials such as silicon carbide (Sic) and AlN, as an example.

EXAMPLE 1

The present invention will be described more specifically with reference to Example 1.
(AlN substrate 10)
 Semiconductor material: AlN
 Substrate size: width 10 mm×length 10 mm×thickness 524 μm
(Processing step S11)
 The processing step S11 according to the embodiment is a step of forming the through holes 11 by irradiating the AlN substrate 10 with the laser L.
(Laser processing conditions)
 Wavelength: 532 nm
 Output power: 3 W/cm$^2$
 Spot diameter: 40 μm
(Heating conditions)
 The AlN substrate 10 disposed under the conditions described above was heat treated under the following conditions.
 Heating temperature: 1800° C.
 Heating time: 10 minutes
 Etching amount: 10 μm
 Nitrogen back pressure: 30 kPa Furthermore, in the strained layer removal step S12, a temperature gradient is appropriately set in order to realize the following etching amount.

Figure 3:
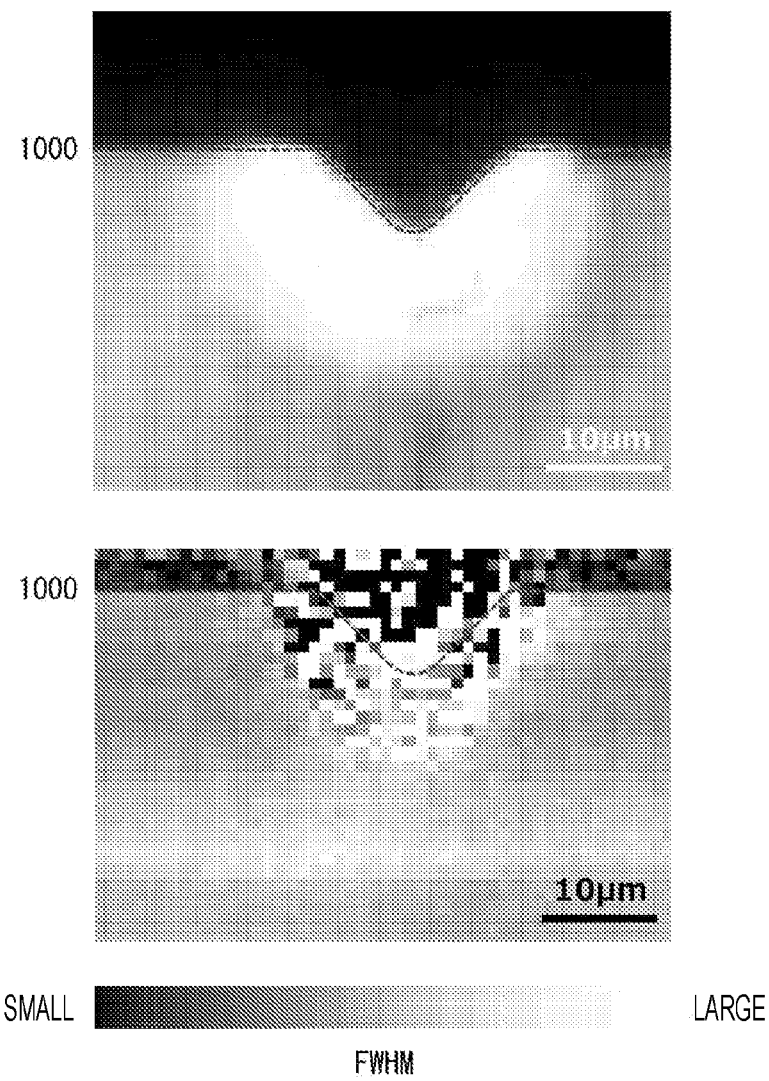
FIG. 3 is an observation image and a Raman spectrometry result of an AlN substrate according to Example 1.

FIG. 3 illustrates a cross-sectional optical microscope image and a Raman spectroscopic mapping image of the AlN substrate 10 subjected to the processing step S11.

Figure 4:
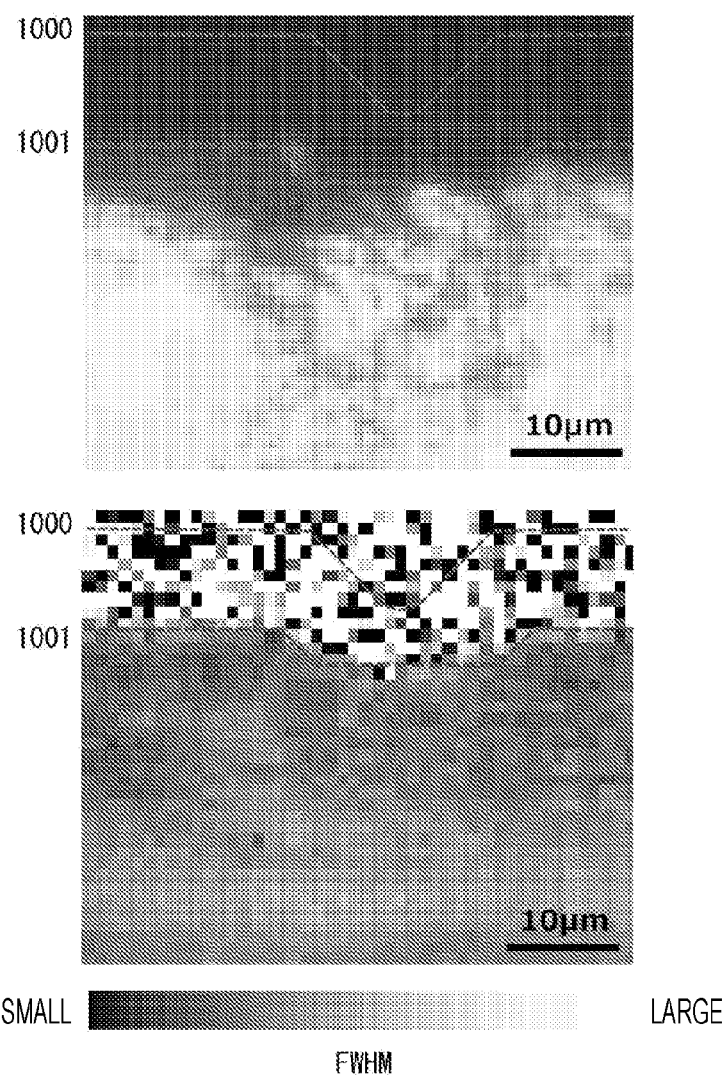
FIG. 4 is an observation image and a Raman spectrometry result of the AlN substrate according to Example 1.

FIG. 4 illustrates a cross-sectional optical microscope image and a Raman spectroscopic mapping image of the AlN substrate 10 subjected to the processing step S11 and the strained layer removal step S12.

FIGS. 3 and 4 respectively illustrate AlN surfaces 1000 and 1001. In addition, FIG. 4 illustrates that the AlN surface 1000 is etched by the strained layer removal step S12 to form the AlN surface 1001.

Moreover, the "Raman spectroscopic mapping image" here indicates mapping results of full width at half maximum (FWHM) at $E_2$ high peak (corresponding to up to 660 $cm^{-1}$).

According to FIGS. 3 and 4, it can be understood that the strained layer 12 (this corresponds to a region where the FWHM in the vicinity of the AlN surface 1000 is large and crystallinity is poor) generated in the vicinity of the concave portion of the AlN surface 1000 in the processing step S11 is removed in the strained layer removal step S12.

EXAMPLE 2

Figure 5:
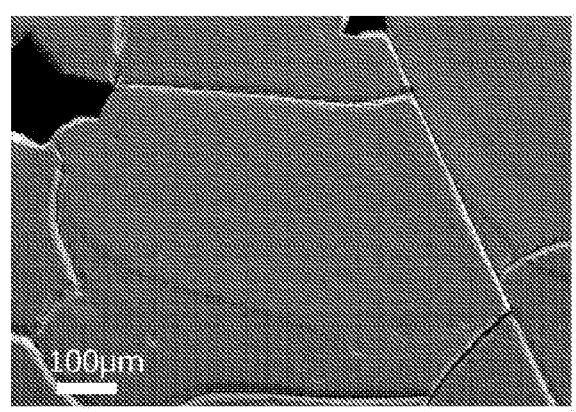
FIG. 5 is an observation image of an AlN substrate heat treated under heating conditions 1 according to Example 2.

The present invention will be described more specifically with reference to Example 2.
(AlN substrate 10)
  Semiconductor material: AlN
  Substrate size: width 10 mm×length 10 mm×thickness 524 μm
The Al surface (0001) of the AlN substrate 10 arranged under the conditions described above was subjected to heat treatment under the following plurality of conditions in the strained layer removal step S12.
(Heating Conditions 1)
  Heating temperature: 1900° C.
  Heating time: 10 minutes
  Nitrogen back pressure: 90 kPa
(Heating Conditions 2)
  Heating temperature: 1700° C.
  Heating time: 10 minutes
  Nitrogen back pressure: 10 kPa
(Heating Conditions 3)
  Heating temperature: 1700° C.
  Heating time: 10 minutes
  Nitrogen back pressure: 90 kPa
(Heating Conditions 4)
  Heating temperature: 1800° C.
  Heating time: 10 minutes
  Nitrogen back pressure: 10 kPa FIG. 5 illustrates an SEM image of the AlN substrate 10 thermally etched under the heating conditions 1. According to FIG. 5, it can be understood that formation of Al droplets associated with nitrogen desorption is suppressed on the surface of the AlN substrate 10 thermally etched under the heating conditions 1.

Figure 6:
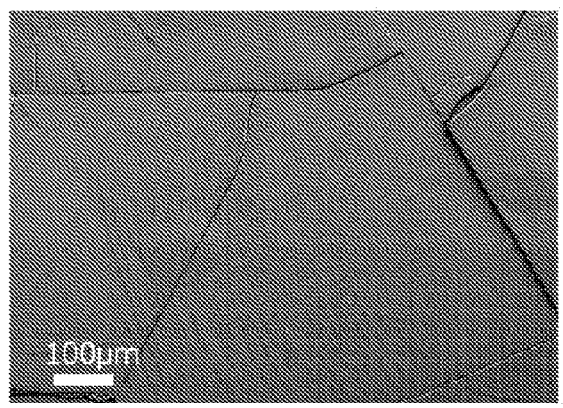
FIG. 6 is an observation image of the AlN substrate heat treated under the heating conditions 2 according to Example 2.

FIG. 6 illustrates an SEM image of the AlN substrate 10 thermally etched under the heating conditions 2. According to FIG. 6, it can be understood that formation of Al droplets is suppressed on the surface of the AlN substrate 10 thermally etched under the heating conditions 2.

Figure 7:
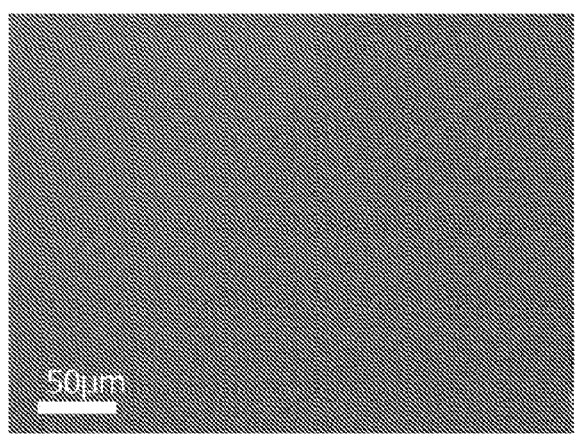
FIG. 7 is an observation image of the AlN substrate heat treated under the heating conditions 3 according to Example 2.

FIG. 7 illustrates an SEM image of the AlN substrate 10 thermally etched under the heating conditions 3. According to FIG. 7, it can be understood that the formation of Al droplets is suppressed on the surface of the AlN substrate 10 thermally etched under the heating conditions 3.

Figure 8:
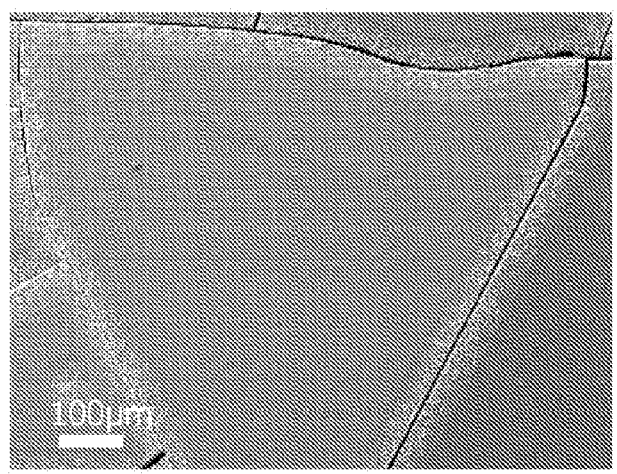
FIG. 8 is an observation image of the AlN substrate heat treated under the heating conditions 4 according to Example 2.

FIG. 8 illustrates an SEM image of the AlN substrate 10 thermally etched under the heating conditions 4. According to FIG. 8, it can be understood that many Al droplets were formed on the surface of the AlN substrate 10 thermally etched under the heating conditions 4 as compared with the case of the other heating conditions 1 to 3.

According to FIGS. 5, 6, 7, and 8, it can be understood that formation of Al droplets in the thermal etching of the AlN substrate 10 under the nitrogen atmosphere can be suppressed by a low heating temperature and/or a high nitrogen back pressure.

In addition, the formation of the Al droplets on the AlN substrate 10 according to the embodiment of the present invention, for example, can be understood as hindering quality improvement of the growth layer in the epitaxial growth on the AlN substrate.

According to the present invention, the strained layer introduced into the aluminum nitride substrate in the process of pattern formation by processing can be removed.

Accordingly, density of defects such as dislocations in the vicinity of each of the upper wall and the side wall of the pattern can be reduced, and takeover of defects such as dislocations in the crystal growth (corresponding to the epitaxial growth) in which the growth surface advances from the upper wall and/or the side wall can be suppressed.
  10 AlN substrate
  11 Through hole
  12 Strained layer
  30 Crucible
  31 Source transport space
  40 Semiconductor material
  50 SiC container
  60 TaC container
  S11 Processing step
  S12 Strained layer removal step

The invention claimed is:

1. A method for manufacturing an aluminum nitride substrate, comprising a strained layer removal step of removing a strained layer of an aluminum nitride substrate by etching the aluminum nitride substrate through a heat treatment under a nitrogen atmosphere,
  wherein the heat treatment is performed under a condition where the heating temperature of the aluminum nitride substrate is 1700° C. or less, and the nitrogen back pressure is 1 kPa or more; or
  wherein the heat treatment is performed under a condition where the nitrogen back pressure is 20 kPa or more.

2. The method for manufacturing an aluminum nitride substrate according to claim 1, further comprising a processing step of performing laser processing of removing a part of the aluminum nitride substrate by irradiating the aluminum nitride substrate with a laser.

3. The method for manufacturing an aluminum nitride substrate according to claim 2, wherein the processing step is a step of forming through holes in the aluminum nitride substrate.

* * * * *